United States Patent [19]
Mahulikar et al.

[11] Patent Number: 5,629,835
[45] Date of Patent: May 13, 1997

[54] METAL BALL GRID ARRAY PACKAGE WITH IMPROVED THERMAL CONDUCTIVITY

[75] Inventors: Deepak Mahulikar, Madison, Conn.; Paul R. Hoffman, Modesto; Jeffrey S. Braden, Livermore, both of Calif.

[73] Assignee: Olin Corporation, Manteca, Calif.

[21] Appl. No.: 277,387

[22] Filed: Jul. 19, 1994

[51] Int. Cl.⁶ .............................. H05K 7/20; H01L 23/34
[52] U.S. Cl. .......................... 361/719; 174/252; 174/257; 174/258; 257/720; 257/713; 257/709; 361/720; 361/713
[58] Field of Search ........................ 174/52.1, 52.4, 174/256, 257, 258, 260, 252; 361/760, 761, 762, 820, 708, 709, 710, 713, 714, 715, 718, 719, 720, 723; 427/96, 388.1, 388.2–388.4, 431, 433; 428/901, 341; 228/180.21; 257/678, 692, 697, 924, 707, 709, 711, 712, 713, 717

[56] References Cited

U.S. PATENT DOCUMENTS

| | | | |
|---|---|---|---|
| 3,642,541 | 2/1972 | Shepard | 428/341 |
| 3,745,095 | 7/1973 | Chadwick et al. | 174/256 |
| 4,153,988 | 5/1979 | Doo . | |
| 4,581,680 | 4/1986 | Garner . | |
| 4,621,026 | 11/1986 | Robinson | 428/341 |
| 4,633,035 | 12/1986 | McMonagle | 174/257 |
| 4,667,526 | 5/1987 | Muehling . | |
| 4,700,473 | 10/1987 | Freyman et al. . | |
| 4,855,869 | 8/1989 | Tsuji . | |
| 4,939,316 | 7/1990 | Mahulikar et al. . | |
| 4,965,227 | 10/1990 | Chang et al. . | |
| 4,997,517 | 3/1991 | Parthasarathi . | |
| 5,025,114 | 6/1991 | Braden . | |
| 5,043,534 | 8/1991 | Mahulikar et al. . | |
| 5,045,914 | 9/1991 | Casto et al. . | |
| 5,045,921 | 9/1991 | Lin et al. . | |
| 5,055,967 | 10/1991 | Sukonnik et al. . | |
| 5,060,844 | 10/1991 | Behun et al. | 228/180.21 |
| 5,066,368 | 11/1991 | Pasqualoni et al. . | |
| 5,098,864 | 3/1992 | Mahulikar | 437/221 |
| 5,103,292 | 4/1992 | Mahulikar | 257/720 |
| 5,124,884 | 6/1992 | Yazu et al. . | |
| 5,155,299 | 10/1992 | Mahulikar et al. . | |
| 5,216,278 | 6/1993 | Lin et al. . | |
| 5,241,133 | 8/1993 | Mullen, III et al. . | |
| 5,397,921 | 3/1995 | Karnezos . | |
| 5,403,975 | 4/1995 | Pasqualoni et al. | 174/52.4 |
| 5,420,460 | 5/1995 | Massingill . | |

FOREIGN PATENT DOCUMENTS

| | | | |
|---|---|---|---|
| 87114577 | 6/1988 | European Pat. Off. . | |
| 2546301 | 4/1977 | Germany | 174/256 |
| 363291439A | 11/1988 | Japan . | |
| 401238143A | 9/1989 | Japan . | |
| 402012933A | 1/1990 | Japan . | |
| 2-12933 | 1/1990 | Japan | 257/678 |
| 3-177055 | 8/1990 | Japan | 257/692 |
| 403177055A | 8/1991 | Japan . | |
| 5-114668 | 5/1993 | Japan | 257/697 |
| 7712929 | 5/1979 | Netherlands | 257/924 |

OTHER PUBLICATIONS

Chin, *Electronic Products*, "More BGA Choices Emerge", Apr. 1995, pp. 20–21.

Iscoff, *Semiconductor International*, "Has the Packaging Revolution Finally Run Out of Steam", Feb. 1995, pp. 67–72.

*Primary Examiner*—Donald Sparks
*Attorney, Agent, or Firm*—Gregory S. Rosenblatt

[57] ABSTRACT

There is disclosed components for electronic packaging applications having integral bumps. A leadframe is formed by etching a metallic strip from one side to form outwardly extending, substantially perpendicular integral bumps. The metallic strip is then etched from the opposite side to form individual leads. When the integrally bumped component is an package base, fatigue of solder balls is reduced.

13 Claims, 12 Drawing Sheets

METAL BALL GRID ARRAY PACKAGE WITH IMPROVED THERMAL CONDUCTIVITY

BACKGROUND OF THE INVENTION

1. Field of the Invention

This invention relates to components for electronic packages having integral bumps. More particularly, leadframes and package bases contain unitary protrusions for electrical interconnection to external circuitry.

2. Description of Related Art

Microelectronic devices are typically manufactured from a semiconductor material such as silicon, germanium or gallium/arsenide. The semiconductor material is fashioned into a die, a generally rectangular structure having circuitry formed on one surface. Along the periphery of that electrically active surface are input/output pads to facilitate electrical interconnection to external circuitry.

The semiconductor device is brittle and requires protection from moisture and mechanical damage. This protection is provided by an electronic package. The electronic package further contains an electrically conductive means to transport electrical signals between the semiconductor device and the external circuitry.

One electronic package is disclosed in U.S. Pat. No. 4,939,316 to Mahulikar et al. which is incorporated by reference in its entirety herein. The patent discloses separate anodized aluminum or aluminum alloy base and cover components defining a cavity. A leadframe is disposed between the base and the cover and adhesively bonded to both. A semiconductor device is encased within the cavity and electrically interconnected to the inner lead ends of the leadframe. The outer lead ends of the leadframe extend beyond the package perimeter and are interconnected to external circuitry.

A similar electronic package having an anodized aluminum or aluminum alloy base component and a cover formed from a material other than aluminum is disclosed in U.S. Pat. No. 5,155,299 to Mahulikar et al.

The available space on a printed circuit board is limited and it is desirable to minimize the peripheral area of a package. The peripheral area of a leaded package extends beyond the perimeter of the package base and cover to a point defined by the outer lead portions of the leadframe.

To minimize the peripheral area of an electronic package, electrical interconnection may be through the base of a package. One such electronic package is disclosed in U.S. Pat. No. 4,965,227 to Chang et al. A plurality of terminal pins support and are electrically interconnected to a flexible metal tape formed into a desired circuit pattern. One end of the terminal pins, the flexible metal circuit and a semiconductor device are then encapsulated in a molding resin. The molding resin defines the package perimeter with the unencapsulated end of the terminal pins extending outward from the package base.

The terminal pins are thin, 0.020 inch diameter copper, as an example, and may be up to 0.5 inch long. The pins are prone to bending and care is required to maintain pin alignment. The pins are plugged into mating holes on a printed circuit board. Care is also required when drilling the holes to insure an accurate fit.

A cross between a leaded package and a pin grid array package is disclosed in U.S. Pat. No. 4,677,526 to Muehling. The outer leads of a leadframe are bent to a 90° angle relative to the plane defined by the inner leads. The inner leads and a semiconductor device are encapsulated in a molding resin with the outer lead portions extending through the package base.

A disadvantage with this package is that the radius of curvature is dependent on the leadframe material and the temper of that material. If the radius is formed too tightly, the leadframe material may crack or "orange peel". Generally, the ratio of the minimum bend radius to the leadframe thickness, mbr/t, is between about 1 and 2 for copper alloy leadframes. A 0.010 inch thick leadframe requires a radius of curvature of at least 0.010 inch to prevent lead fracture.

Metallic solder pads and solder balls are used in a ball grid array and land grid array packages as disclosed in U.S. Pat. No. 5,241,133 to Mullen, III et al. The patent discloses an electronic package having an insulating substrate with circuit traces on a first side and a uniform array of solder pads on an opposing second side. A semiconductor device is mounted to the first side of the substrate and electrically interconnected to the circuit traces. Conductive vias electrically interconnect the circuit traces and the solder pads. A molded plastic cover encapsulates the device and inner lead ends.

A ball grid array package having a metallic base is disclosed in U.S. patent application Ser. No. 08/033,596 entitled "Ball Grid Array Electronic Package" by Mahulikar et al., filed Mar. 19, 1993. A metallic base component has an array of holes. The walls of the holes are electrically nonconductive. If, for example, the base is aluminum or an aluminum alloy, the hole walls are made nonconductive by anodization. Terminal pins, a solder or a conductive adhesive extend through the holes terminating approximately in the plane defined by the outside surface of the base.

A problem with ball grid array packages is the coefficient of thermal expansion (C.T.E.) mismatch between the semiconductor package and a printed circuit board causes the solder balls to be extended or compressed with temperature variations. This flexing fatigues the solder balls and eventually causes failure of the solder joint.

A solution to solder fatigue is disclosed in U.S. Pat. No. 4,581,680 to Garner. Metallization pads are formed in recesses on the package base. The depth of the recesses increases with the distance between the recess and the center of the package base. Longer length solder joints around the periphery of the package provide improved flexibility to compensate for the C.T.E. mismatch.

There exists, however, a need for an improved leadframe having outer leads perpendicular to the inner leads. There exists also a need for a ball grid array electronic package or land grid array electronic package that reduces solder fatigue

SUMMARY OF THE INVENTION

Accordingly, it is a first object of the invention to provide a leadframe having outer lead ends substantially perpendicular to the inner lead portion that is not constrained by a minimum bend radius dependent on the thickness. It is a second object of the invention to provide a ball grid electronic package that has reduced solder fatigue.

It is a feature of the invention that both the first object and the second object are met by integrally bumped package components. It is a feature of the invention that a leadframe is formed by etching outer lead protrusions from a relatively thick strip of an electrically conductive material. The protrusions are formed by etching rather than stamping and the minimum bend radius is not dependent on the leadframe thickness. It is an advantage of the invention that the radius may approach zero.

Another feature of the invention is that integral bumps are formed in the package substrate. These bumps support the package and form standoffs to prevent the weight of the package from distorting the solder balls. It is an advantage of the invention that the integral bumps reduce the volume of the solder required to interconnect the package and a printed circuit board increasing the number of thermal cycles before fatigue failure.

The above stated objects, features and advantages, as well as others, will be apparent from the specification and drawings that follow.

DETAILED DESCRIPTION

Figure 1:
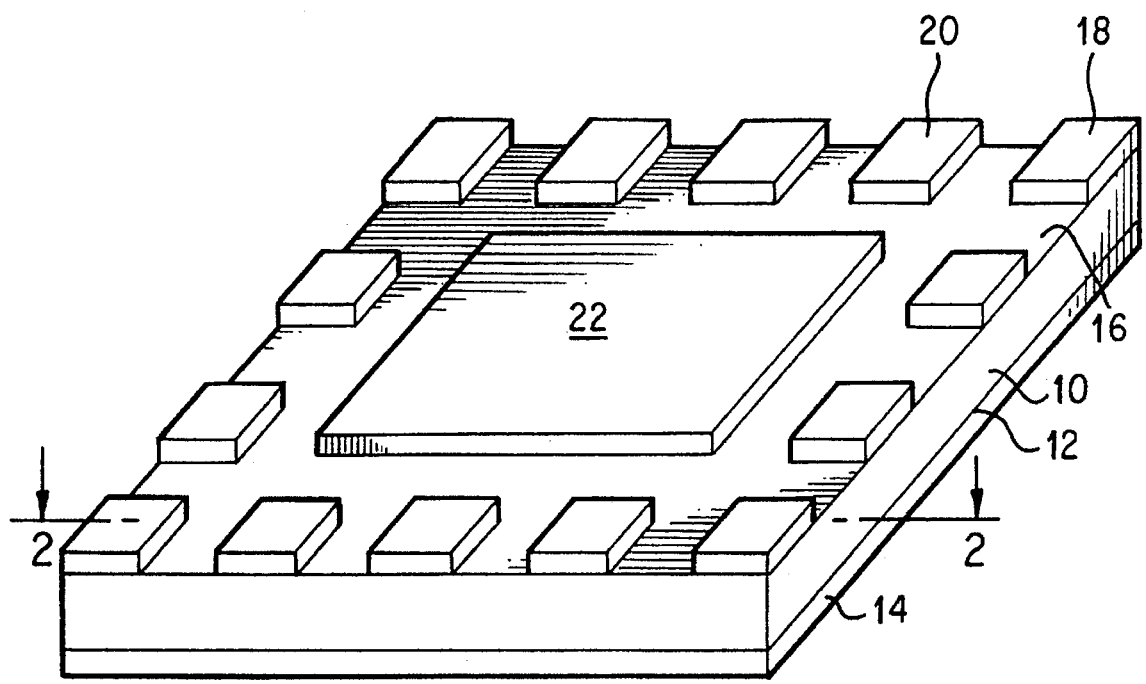
FIG. 1 shows in top perspective view a metallic strip prepared for etching to form a leadframe in accordance with the invention.
Figure 2:
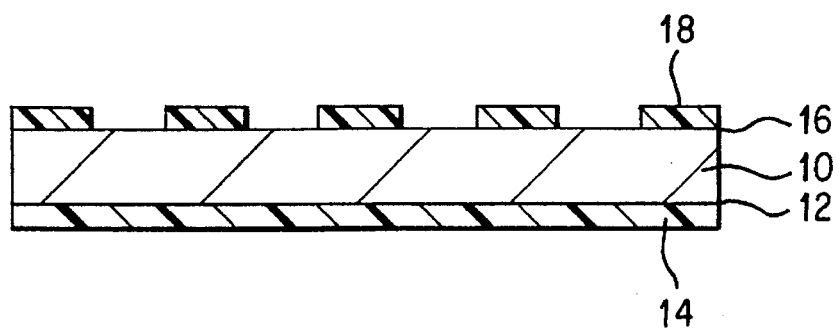
FIG. 2 shows in cross sectional representation the metallic strip of FIG. 1.

FIG. 1 shows in a perspective view a first method for the manufacture of a leadframe from a metallic strip 10 in accordance with the invention while FIG. 2 illustrates the same metallic strip when viewed along cross-sectional line 2—2.

The metallic strip 10 is formed from any electrically conductive material that is readily etched such as copper, copper alloys and iron-nickel alloys. Copper alloys are preferred because of the high electrical conductivity of copper and the ease with which copper is etched. Suitable copper alloys include those designated by the Copper Development Association (CDA) as C194 (nominal composition by weight 2.35% iron, 0.03% phosphorous, 0.12% zinc, balance copper) and C7025 (nominal composition by weight 3.0% nickel, 0.65% silicon, 0.15% magnesium and the balance copper).

The thickness of the metallic strip 10 is determined by the desired thickness of the integral bumps as described below. Typically, the thickness of the metallic strip 10 is from about 0.15 millimeter to about 0.51 mm (0.006 to 0.020 inch) and preferably from about 0.20 mm to about 0.30 mm (0.008 to 0.012 inch).

A first side 12 of the metallic strip 10 is coated with a first resist 14. The first resist 14 is any polymer that resists attack in the chemical solution used to etch the metallic strip 10 and is also preferably photoimageable to facilitate circuit manufacture. One suitable first resist is "RISTON" (trademark of DuPont, Wilmington, Del.). The resist is applied by any suitable method such as spraying, screening or dipping. The entire first side 12 of the metallic strip 10 is preferably coated with the first resist 14.

The opposing second side 16 is selectively coated with a second resist 18. The second resist 18 is any polymer that is chemically resistant to the etching solution and may have the same composition as the first resist 14. The second resist 18 is deposited as a plurality of discrete pads 20 corresponding to a desired array of bumps in the integrally bumped leadframe. A centrally positioned discrete pad 22 may be included if an integral heat sink is also desired.

Figure 3:
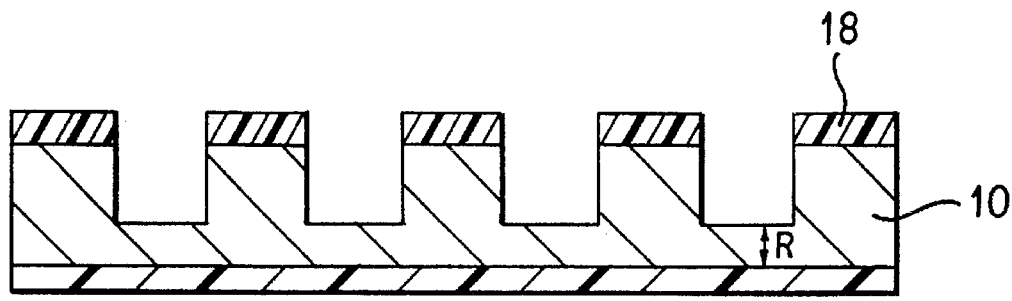
FIG. 3 shows in cross sectional representation of the metallic strip following a first etching operation.

The resist coated metallic strip 10 is immersed in a suitable chemical etch solution. For a copper alloy, immersion in an aqueous solution containing a mixture of cupric chloride and hydrochloric acid at a temperature of 55° C. will etch the metallic strip at a rate of about 0.04 mm (0.0016 inch) per minute. As illustrated in FIG. 3, the metallic strip 10 is immersed in the etch solution for a time sufficient to etch those portions of the metallic strip not covered with the second resist 18 to a remaining thickness, "R", of from about 0.013 mm to about 0.1 mm (0.0005–0.004 inch).

Figure 4:
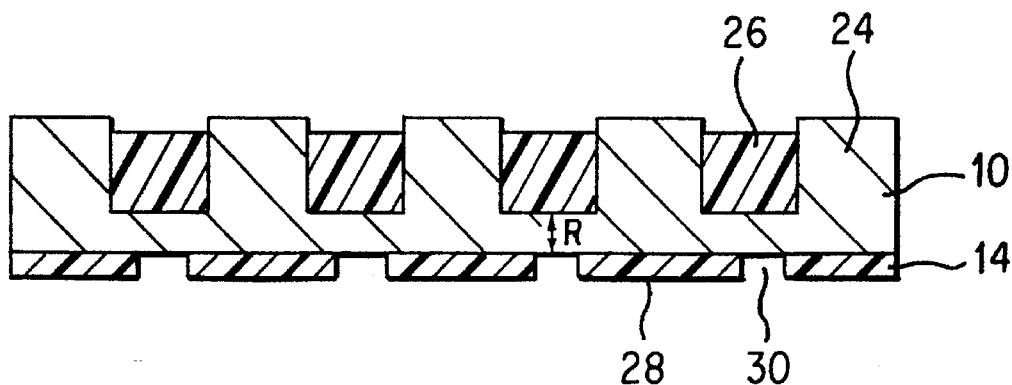
FIG. 4 shows in cross sectional representation the etched metallic strip of FIG. 3 having a polymer backing layer.

The second resist 18 is then removed by dissolution in a suitable solvent. For RISTON, sodium carbonate is a suitable solvent for portions not exposed to ultraviolet radiation while sodium hydroxide is suitable for those portions exposed to ultraviolet radiation. Removal of the second resist 18 exposes the integral bumps 24 as illustrated in FIG. 4. The integral bumps 24 are unitary with the metallic strip 10 and form the outer lead portions of the leadframe.

The remainder, "R", of the metallic strip 10 after etching is thin and it is preferable to support the etched metallic strip 10. A polymer resin 26 fills the etched portion between the integral bumps 24. The polymer resin is chemically resistant to the etch solutions and also effective for increasing the rigidity of the etched metallic strip. One suitable polymer 26 is an epoxy.

The polymer resin 26 fills the etched portions to a height less than the height of the integral bumps 24. Preferably, the integral bumps 24 extend from about 0.1 mm to about 0.4 mm (0.004–0.015 inch) above the height of the polymer resin 26.

The first resist 14 is now imaged into desired circuit patterns. This imaging may be by photolithography as known in the art. A mask partially obscures the first resist 14 from a radiating polymerization source such as an ultraviolet (UV) light. Those portions 28 of the first resist 14 exposed to the UV light polymerize and are not removed in a selected solvent (for a "positive" photoresist). The portions 30 of the first resist shielded from the UV source are readily removed by the selected solvent.

After removal of the unexposed portions 30 of the first resist 14, the metallic strip 10 is immersed in a suitable etch solution. To avoid chemical dissolution of the integral bumps 24, either the bumps are coated again with resist or the strip 10 is only partially immersed in the chemical solution with the integral bumps remaining outside the solution.

Figure 5:
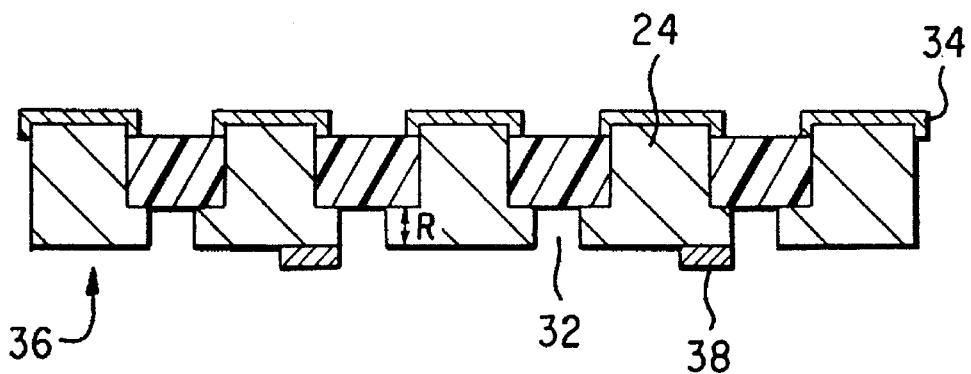
FIG. 5 shows in cross sectional representation the metallic strip following a second etching operation.

The chemical solution etches electrical isolation channels 32 through the remainder, "R", of the metallic strip 10 as shown in FIG. 5 completing the leadframe.

The integral bumps 24 may be coated with a solderable material 34 such as gold or tin to facilitate bonding to a printed circuit board. Alternatively, the integral bumps are coated with a tin/lead alloy solder or other low melting temperature solder. The solderable material 34 is preferably applied by electrolytic plating and has a thickness of from about 1 to about 5 microns with gold coatings being toward the low end of the range and solder coatings toward the high end of the range.

The opposing side 36 of the leadframe may be entirely or selectively coated with a wire bondable layer 38 such as silver or aluminum. The wire bondable layer has a thickness of from about 0.5 to about 2 microns and is preferably applied either electrolytically, for silver, or by vapor deposition, for aluminum.

Figure 6:
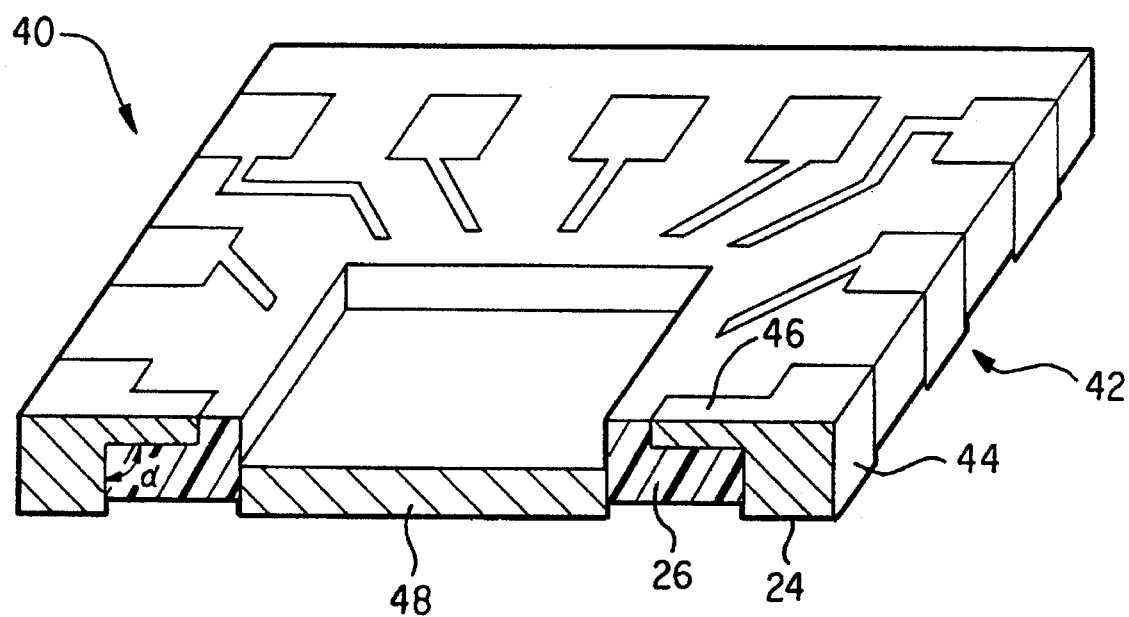
FIG. 6 shows in perspective view of the leadframe of the invention.

The leadframe 40 is illustrated in a perspective and partially cross sectional view in FIG. 6. The metallic strip has been etched to form a plurality of electrically isolated leads 42 each having an outer portion 44 terminating at an integral bump 24 extending beyond the depth of a supporting polymer resin 26. The leads 42 have an inner lead portion 46 extending toward a central region of the leadframe 40.

Optionally, as illustrated in FIGS. 1 and 6, a centrally positioned heat spreader 48 is formed from the same metallic strip. One or more semiconductor devices are then bonded to either the heat spreader 48 or to the polymer resin 26 and electrically interconnected to the inner lead portions 46.

The advantages of the leadframe 40 as compared to prior art leadframes is that the outer lead portions 44 extend downward, rather than outward reducing the peripheral dimensions of an electronic package. The outer lead portions 44 are formed substantially perpendicular to the inner lead portions 46 by etching, rather than bending. As a result, the angle, α, between the outer lead portions 44 and inner lead portions 46 approaches 90° and is not limited by mbr/t.

Figure 7:
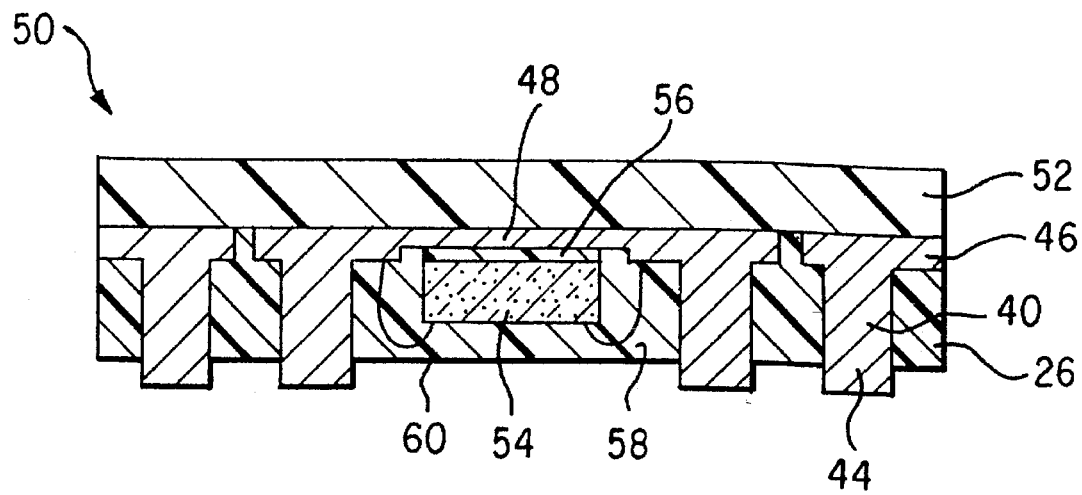
FIG. 7 shows in cross sectional representation of a cavity down molded plastic electronic package formed according to the invention.

FIG. 7 illustrates a cavity down electronic package 50 utilizing the leadframe 40 of the invention. The outer lead portion 44 extends beyond a polymer resin 26 for electrical interconnection to external circuitry. The inner lead portion 46 is patterned into circuit traces and a heat spreader 48. To electrically isolate circuit traces and prevent contamination from causing a short circuit, a backing layer 52 may be applied over the inner lead portion. One suitable backing layer is a polymer such as epoxy or polyimide. A second suitable backing layer 52 is a metallic substrate coated with an electrically insulating layer similar to the package bases described below.

At least one semiconductor device 54 is bonded to the heat spreader 48 by a suitable die attach material 56. Any conventional die attach material may be utilized such as a low melting temperature lead/tin alloy solder or a silver filled epoxy adhesive. The semiconductor device is electrically interconnected to the inner lead portion 46 of the leadframe 40 by small diameter bond wires 58 or by thin strips of copper foil as known from tape automated bonding ("TAB").

After electrical interconnection, a potting compound 60 such as an epoxy or a silicone encapsulates the semiconductor device 54, bond wires 58 and a portion of the inner leads 46 adjacent the bond wires.

Figure 8:
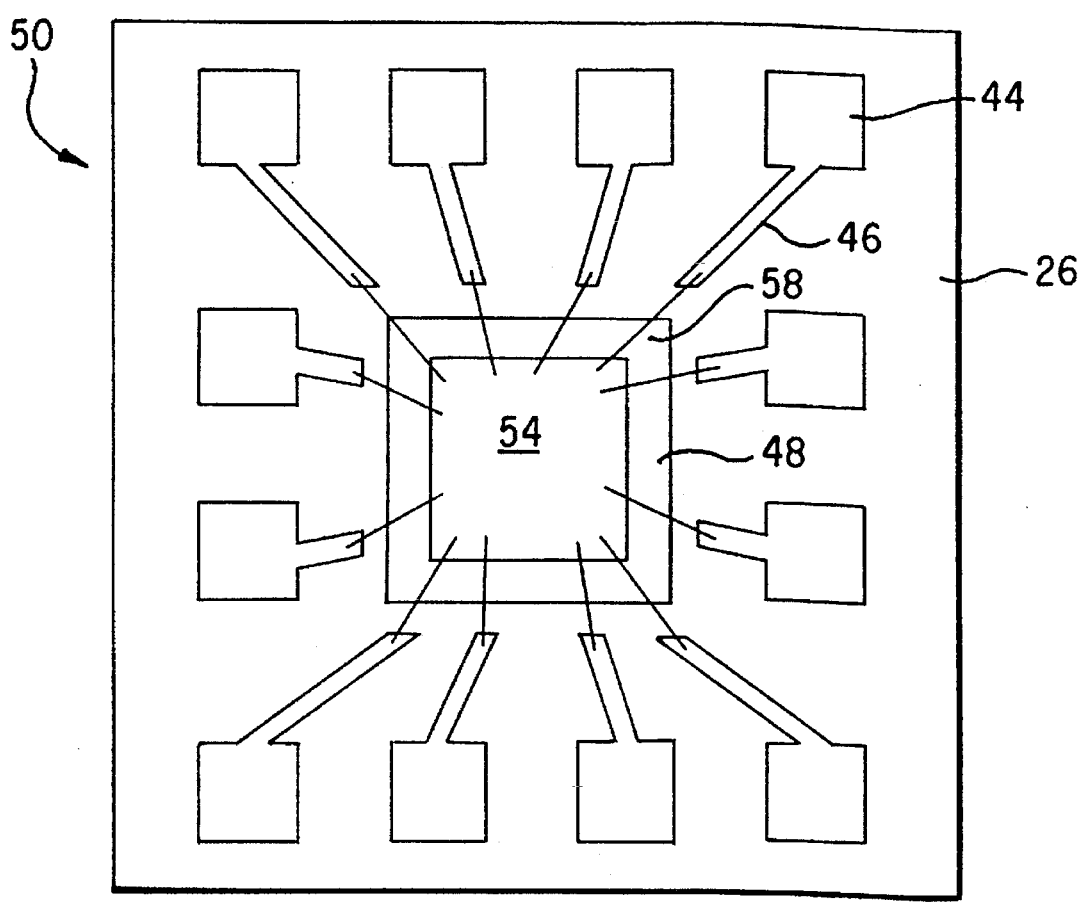
FIG. 8 shows in bottom planar view the cavity down package of FIG. 7.

FIG. 8 illustrates the package 50 in bottom planar view with the potting compound removed for clarity. The outer lead portions 44 extend upward supported by the polymer resin 26. The semiconductor device 54 is bonded to the heat spreader 48 and electrically interconnected to the inner lead portions 46.

Figure 19:
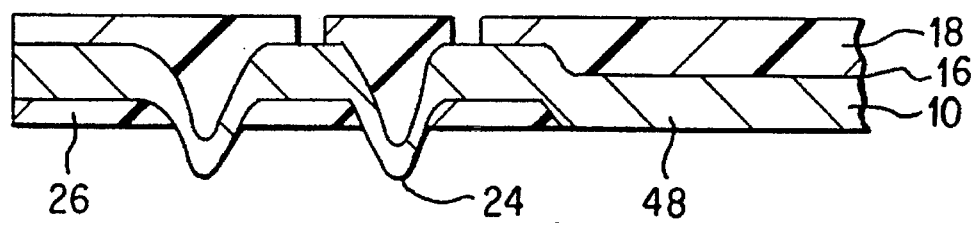
FIG. 19 shows in cross sectional representation a stamped leadframe having bumps in accordance with an embodiment of the invention.
Figure 20:
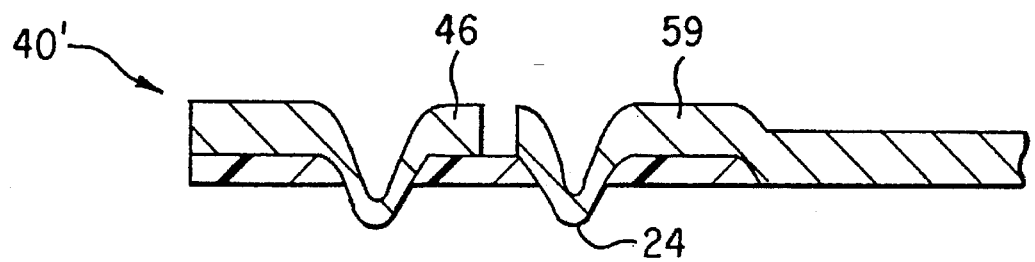
FIG. 20 shows in cross sectional representation the leadframe of FIG. 19 after etching to electrically isolate the leads.

An alternative method of manufacturing the leadframe is illustrated in cross sectional representation in FIGS. 19 and 20. In FIG. 19, a metallic strip 10 is mechanically deformed, such as by deep drawing or cupping, to form a plurality of integral bumps 24 and, optionally, a heat spreader 48. A polymer resin 26 is applied to support the leads and a second resist 18 is applied to the second side 16 of the metallic strip 10.

The second resist 18 is patterned, such as by photolithography, to form desired circuit patterns. The leadframe structure is immersed in a suitable etching solution, taking care not to etch the integral bumps 24, electrically isolating the inner lead portions as shown in FIG. 20. The leadframe 40' is then used in the same manner as the leadframe 40 described above.

An advantage with the leadframe 40' is that the integral bumps 24 are formed by stretching the metallic strip 10. The bumps are thinner than the undeformed portions 59 of the metallic strip and are very compliant. C.T.E. mismatch between the printed circuit board and the electronic package is compensated by flexing of the integral bumps 24 reducing the cyclical stress applied to the solder bumps, thereby reducing fatigue.

Figure 9:
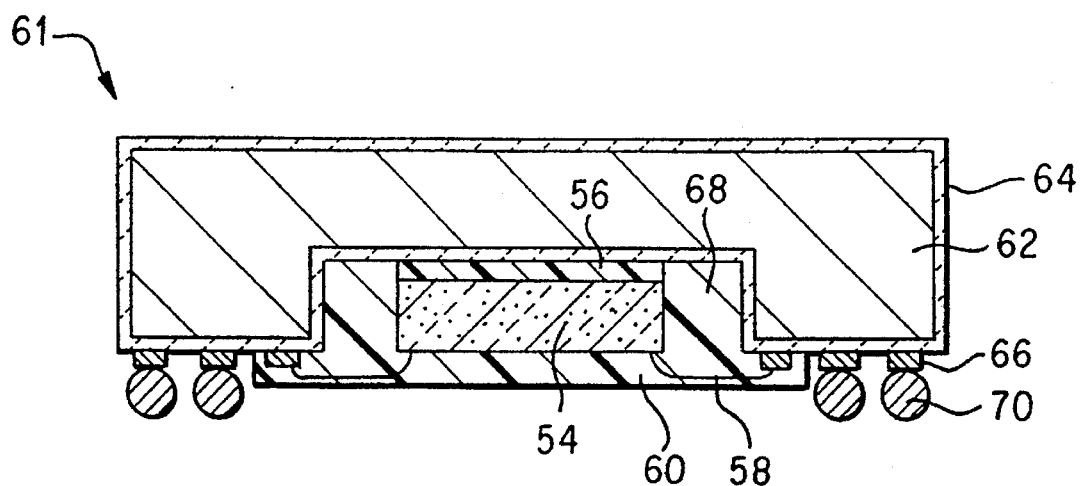
FIG. 9 shows in cross sectional representation a ball grid array electronic package according to an embodiment of the invention.

FIG. 9 illustrates a ball grid array package 61 in accordance with an embodiment of the invention. The ball grid array package 60 has a base 62. The base 62 may be any suitable material such as a metal, polymer or ceramic. Metals are preferred to exploit the high thermal conductivity, etchability and machinability. If the base 62 is electrically conductive, the base is coated with an electrically insulating layer 64.

A preferred material for the metallic base is aluminum or an aluminum alloy. The electrically insulating layer 64 is then an anodization layer. Aluminum is light weight and applies less weight to the solder balls than a similarly sized base formed from a more dense material. The reduced weight leads to less creep in the solder balls as a function of time. Creep is a problem in that the closely spaced solder balls could contact forming a short circuit.

Anodized aluminum is not wet by molten solder balls. The solder balls therefore do not migrate away from the desired trace location. The infrared emissivity of black integrally anodized aluminum allows effective heat transfer. The packages of the invention work well with current surface mount technology (SMT) infrared solder reflow equipment.

Aluminum has a low elastic modulus and a minimal compressive and expansive effect on the solder balls reducing solder ball fatigue.

The base 62 can be formed from other anodizable metals such as titanium or a titanium alloy or from a non-anodizable metal such as copper. If a non-anodizable metal is used, the metal may be coated with an electrically insulating layer 64 such as $Al_2O_3$ or polymer. Also suitable are metals capable of forming a refractory oxide layer in situ, such as a copper alloy containing from about 2% to about 12% by weight aluminum.

Circuit traces 66 are formed on the insulating layer by any suitable means. A conductive ink may be deposited by screen printing and copper electrolytically deposited on the conductive ink to a desired thickness and electrical conductivity. Alternatively, the circuit traces 66 may be deposited by vapor deposition or by direct writing. If the insulating layer 64 is an insulating sheet such as an organic polymer, a metallic foil may be bonded to the sheet and photoimaged into desired circuit patterns using conventional flexible circuit techniques.

A semiconductor device 54 is bonded to a central portion of the base 62 by a die attach 56. Optionally, to reduce the height of the wire bonds 58, a cavity 68 is formed in the base 62. The device 54 is electrically interconnected to the circuit traces 66 by the wire bonds 58. The device, wire bonds 58 and that portion of the circuit traces 66 adjacent the wire bonds 58 are then encapsulated in a potting compound 60.

Peripheral portions of the circuit traces 66 are bonded to solder balls 70 for electrical interconnection to external circuitry. Alternatively, the package base may contain recessed dimples for alignment of the solder balls. Circuit traces or electrically conductive vias provide contact with the solder balls.

When the electrically insulating layer 64 is an anodic film, the film has a uniform dispersion of pores as disclosed in U.S. Pat. No. 5,066,368 to Pasqualoni et al. which is incorporated by reference in its entirety herein. Superior adhesion to a polymeric die attach material 56 and potting compound 60 is obtained when the pore size is from about 50 to about 500 angstroms. However, the pores interfere with the deposition of the circuit traces 66. Accordingly, in a preferred embodiment of the invention, in that portion of the insulating layer underlying the polymers the pores are not sealed. The remainder of the insulating layer is preferably sealed.

The anodization layer is sealed by any conventional process such as immersion in boiling water for 15–30 minutes or immersion in a hot aqueous solution containing nickel acetate.

The portion of the insulating layer 64 that will underlie the die attach material 56, as well as optionally, the side walls of the cavity 68 are masked during the sealing step to retain open pores.

Figure 10:
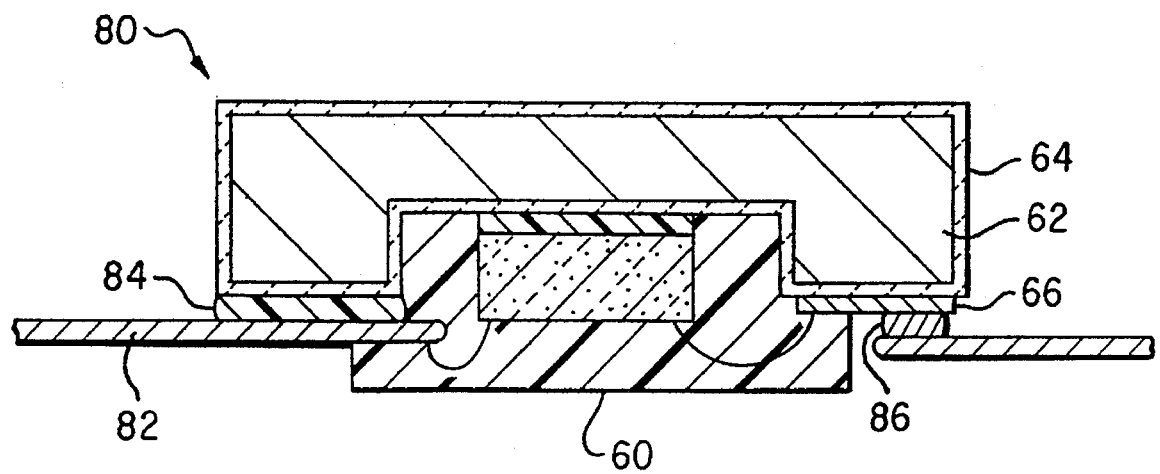
FIG. 10 shows in cross sectional representation a leaded electronic package in accordance with the invention.

A leaded package 80 in accordance with the invention is illustrated in cross sectional representation in FIG. 10. The package has a metallic base 62 coated with an electrically insulating layer 64. The leads 82 of a leadframe are either bonded to the insulating layer 64 by a polymer adhesive 84 or bonded to a circuit trace 66 by a low temperature solder 86 or other conductive medium.

If the insulating layer is an anodic film, the pores are preferably sealed on all surfaces except those that contact a polymer adhesive or polymer die attach. A potting compound then seals the semiconductor device 54, the wire bonds 58 and either the inner lead portion or circuit trace portion adjacent the wire bonds.

Figure 11:
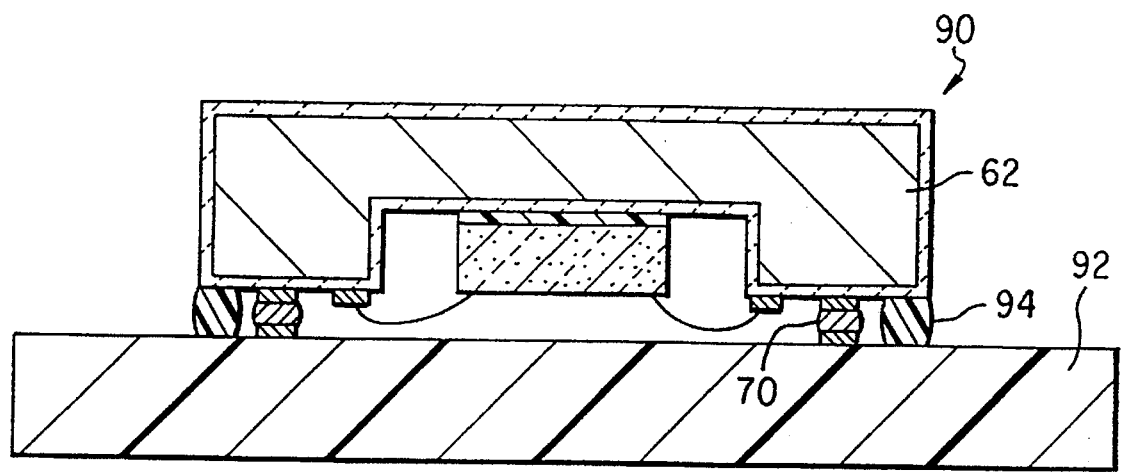
FIG. 11 shows in cross sectional representation a ball grid array electronic package including a polymer sealant stand-off.

FIG. 11 illustrates in cross sectional representation an electronic package 90 that resists fatigue of the solder balls 70. Solder ball fatigue is caused by cyclical expansion and contraction of the solder balls when the electronic package 90 and a printed circuit board 92 have different coefficients of thermal expansion. When the printed circuit board is FR-4, a fire resistant, glass filled epoxy, the C.T.E. is about equal to that of copper $180 \times 10^{-7}/°C$. If the package base 62 is aluminum, the C.T.E. is about $230 \times 10^{-7}/°C$. and if the package base as alumina, the C.T.E. is about $60 \times 10^{-7}/°C$.

By the inclusion of a standoff 94, expansion and contraction of the solder balls 70 is minimized, reducing solder creep, solder fatigue and squashing of the solder balls. Also, C.T.E. mismatch induced stress in the plane of the base (X&Y directions) is reduced. The standoff 94 is material having a yield stress greater than that of the solder forming the solder balls 70. A typical solder composition is 60% Sn/40% Pb having a mean tensile strength of about 52.5 MPa (7.61 ksi) and a limiting creep rupture strength of 1000 hours at a stress of 4.5 MPa (650 psi) at 26° C. The limiting creep rupture strength is 1000 hours at a stress of 1.4 MPa (200 psi) at 80° C. The creep rupture strength is the stress that will cause fracture in a creep test at a given time in a specified environment.

A polymer suitable as a standoff with a yield stress above this value is an epoxy. The standoff 94 prevents the spacing between the package 90 and the printed circuit board 92 from changing in response to temperature fluctuations. Preferably, the C.T.E. of the polymer sealant is as low as possible so as not to contribute to cycling of the solder balls.

While the standoff may be any suitable material, adhesives are preferred. The standoff is then applied as a ring about the perimeter of the package 90 providing greater environmental protection for the semiconductor device 54.

Figure 12:
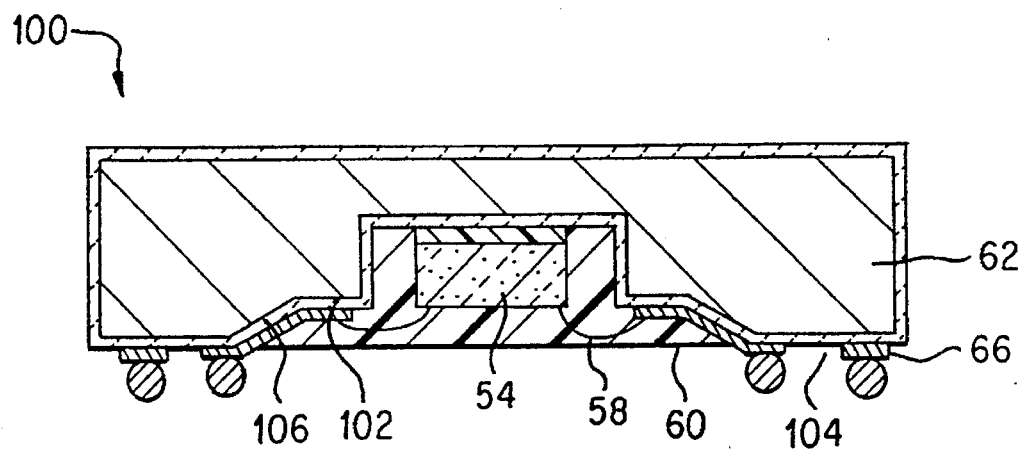
FIG. 12 shows in cross sectional representation a ball grid array electronic package having a wire bond shelf.

FIG. 12 illustrates in cross sectional representation an electronic package 100 having a wire bond shelf 102. The wire bond shelf 102 is substantially coplanar with the surface 104 of the package base 62 having circuit traces 66. The coplanarity facilitates uniform deposition of the circuit traces by a line of site deposition process such as vapor deposition and also screen printing of photoresists and conductive inks. The side walls 106 between the wire bond shelf 102 and the surface 104 form an angle of less than 90° C. and preferably between about 40° C. and 60° C. to facilitate uniform deposition of the circuit traces 66 and other materials. As with prior embodiments, a potting compound 60 may be utilized to seal the semiconductor device 54 and wire bonds 58.

Figure 13:
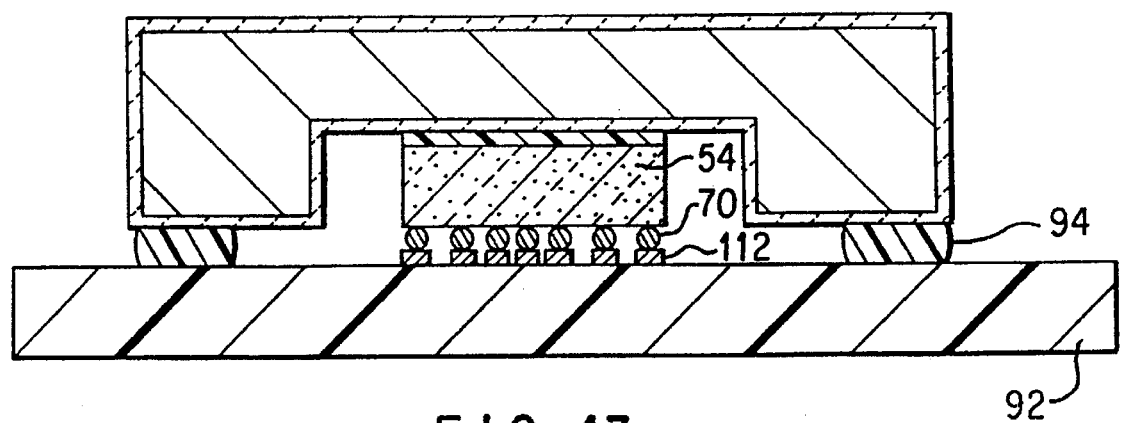
FIG. 13 shows in cross sectional representation a flip chip bonded electronic package having a polymer sealant stand-off.

FIG. 13 illustrates in cross sectional representation, an electronic package 110 with a semiconductor device 54 directly bonded to a printed circuit board 92. This technique is called flip chip bonding or controlled collapse chip connection (C4) and is more fully described in U.S. patent application Ser. No. 08/120,609 entitled "Flip Chip in Metal Electronic Package" by Braden et al. which was filed Sep. 13, 1993. The Braden et al. patent application is incorporated by reference its entirety herein.

The large number of small solder balls 70 that electrically interconnect the device 54 to circuit traces 112 on the printed circuit board 92 are particularly prone to fatigue failure and creep. The failure of even a single solder ball may render the entire device ineffective. By using a standoff 94 as described above, cyclic compression and expansion of the solder balls 70 is minimize reducing fatigue. X&Y direction C.T.E. induced stress is also reduced.

Figure 14:
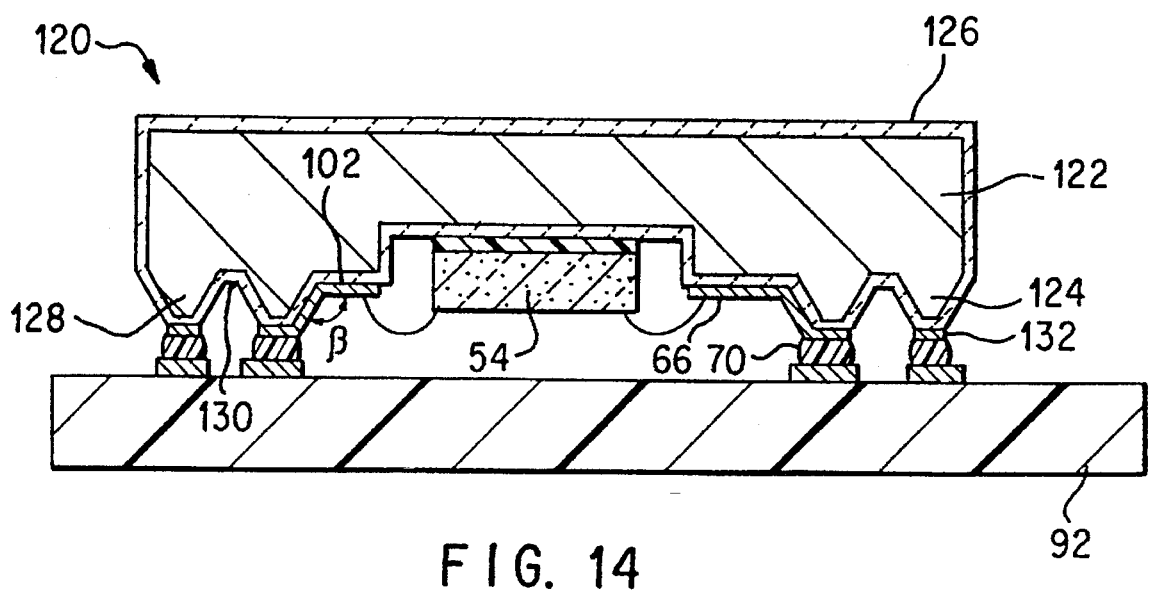
FIG. 14 shows in cross sectional representation a cavity down ball grid array electronic package having integral bumps.

FIG. 14 illustrates in cross sectional representation an electronic package 120 having a base component 122 that further reduces solder fatigue. The base 122 has a plurality of integral bumps 124 unitary with the base and formed by stamping, milling or chemical etching. Alternatively, the base 122 is formed by molding or sintering. The base 122 and the integral bumps are coated with an insulating layer 126 if formed from an electrically conductive material. No insulating layer is required if the base is formed from an electrically nonconductive material such as alumina or aluminum nitride.

Preferably, the base 122 is formed from an anodizable metal such as aluminum or an aluminum alloy and the insulating layer 126 is an anodic film having a thickness of from about 5 microns to about 50 microns and preferably from about 10 microns to about 25 microns.

The integral bumps have a peak 128 to valley 130 height of from about 0.4 mm to about 0.8 mm (0.015–0.030 inch) and preferably from about 0.5 mm to about 0.65 mm (0.020–0.025 inch).

The integral bumps 124 separate the electronic package 120 from the printed circuit board 92 and as a result, only a small diameter solder ball 70 is required to bond the package to the printed circuit board. The reduced volume of the solder balls reduces the amount of compression and expansion, minimizing fatigue failure and creep.

The circuit traces 66 electrically interconnect the semiconductor device 54 to the solder balls 70. To facilitate deposition of the circuit traces 66, the angle, β, between the plane of the wire bond shelf 102 and the integral bump 124 is either between 30° and 60° or between 120° and 150° depending on the direction of measurement. Preferably, the angle, β, is either between 40° and 50° or between 130° and 140°.

The peak 128 of the integral bumps 124 may be coated with a solderable material 132 to facilitate solder ball 70 attachment. Suitable solderable materials include gold, tin, and tin/lead alloy solders.

Figure 15:
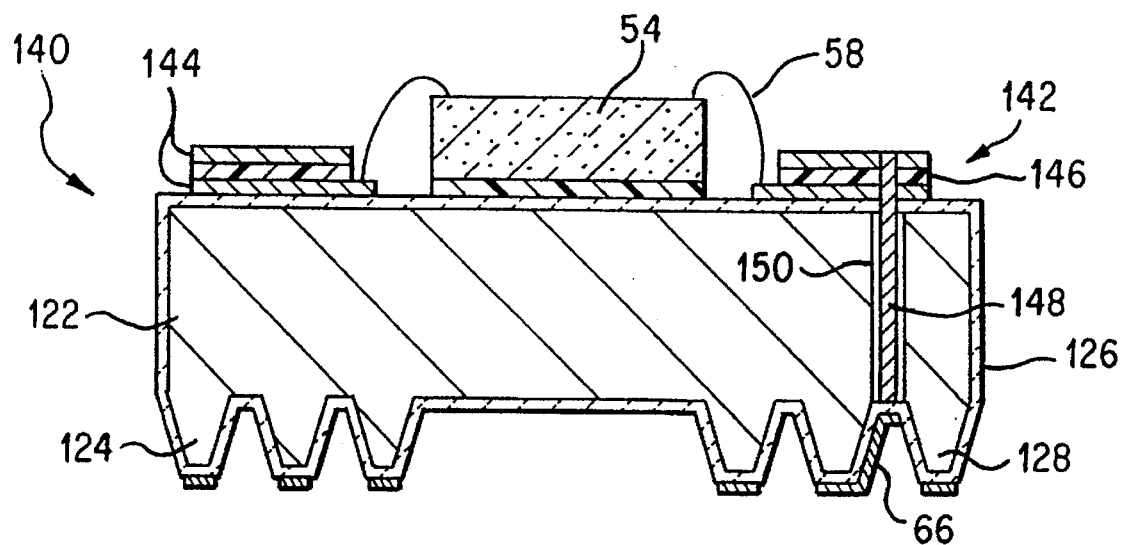
FIG. 15 shows in cross sectional representation a cavity up ball grid array electronic package having a multilayer circuit.

FIG. 15 illustrates a cavity up electronic package 140 having a circuit 142 bonded to the insulating layer 126 of a metallic base 122. The circuit 142 may be a single conductive layer formed on the insulating layer by any known metallization technique or may comprise one or more conductive layers 144 separated and bonded by one or more electrically insulating layers 146. Typically, the conductive layers are a copper or copper alloy foil and the intervening insulating layers 146 a polyimide. Circuit traces are photolithographically formed in the conductive layers. The semiconductor device 54 is electrically interconnected to the circuit traces by wire bonds 58.

A conductive via 148 is formed through the base 122. The walls of a through hole of a metallic base is made electrically nonconductive by coating with an insulating layer 150 such as an anodic film. The hole is then filled with a conductive material such as a solder, silver filled polymer or a copper terminal pin. Alternatively, the vias 148 are filled by vapor deposition when forming the conductive circuit traces 144. The conductive material interconnects the conductive layers 144 with circuit traces 66 extending to the peaks 128 of the integral bumps 124.

Figure 16:
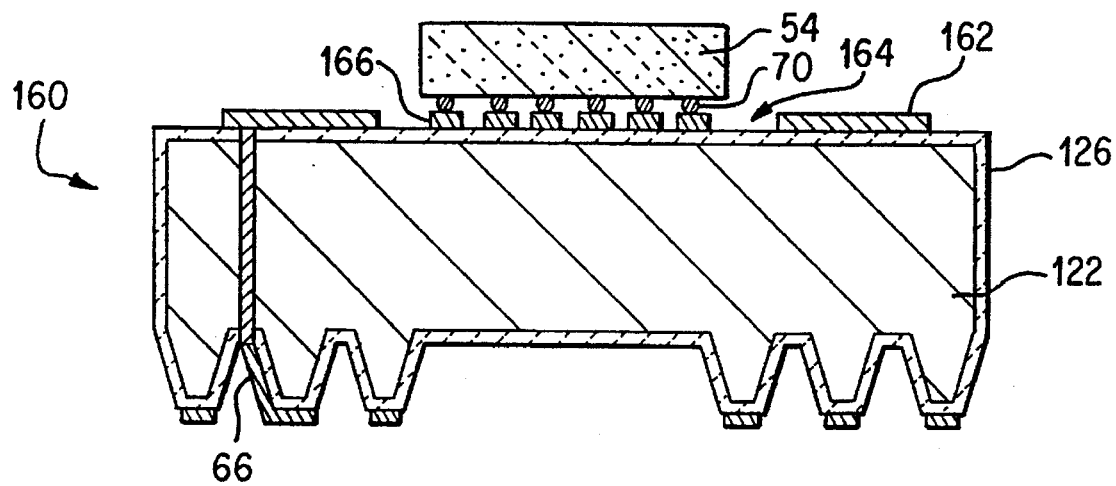
FIG. 16 shows in cross sectional representation a cavity up ball grid array electronic package having a flip chip bonded semiconductor device.

FIG. 16 illustrates in cross sectional representation a cavity up ball grid electronic package 160 having a flip chip bonded semiconductor device 54. The package 160 has a base 122 that is preferably metallic. If the base 122 is electrically conductive, then an insulating layer 126 is provided. Circuit traces 162 are formed on a surface 164 of the base 122. Included with the circuit traces is a conductive array 166 that aligns with an array of input/output pads on an electrically active face of the semiconductor device 54. Solder balls 70 electrically interconnect the conductive array 166 to the semiconductor device 54.

One or more conductive vias 148 electrically interconnect the circuit traces 162 with circuit traces 66 formed on the integral bumps 124 on the opposing side of the base.

Figure 17:
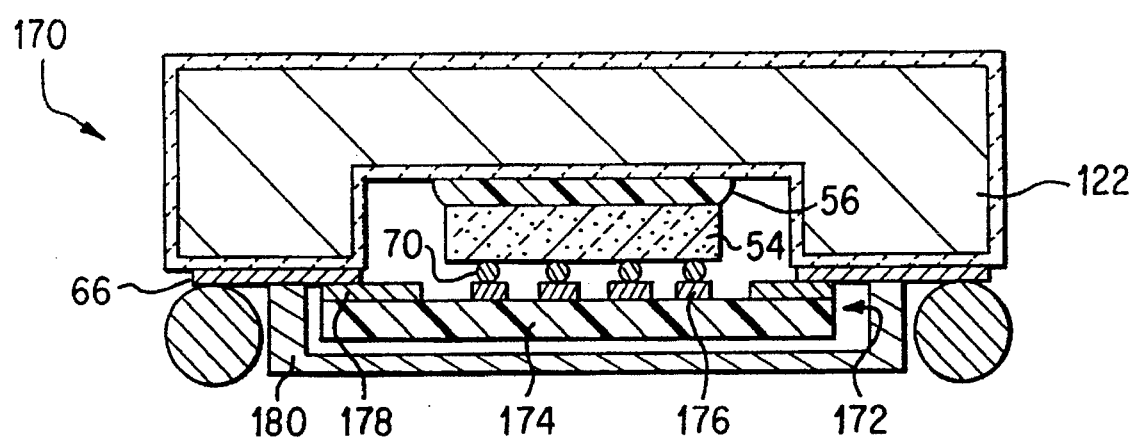
FIG. 17 shows in cross sectional representation a cavity down ball grid array electronic package having a flip chip bonded semiconductor device.

FIG. 17 shows in cross sectional representation a cavity down ball grid array electronic package 170. This package is free of conductive vias increasing the ease of manufacture and reliability.

A semiconductor device 54 is bonded to the package base 122 by a die attach material 56 that may be a low melting temperature solder or a polymer adhesive. Thermal greases and other highly thermally conductive materials such as silver or graphite filled adhesives are also desirable to maximize the conduction of heat from the device 54 to the base 122.

A circuit board 172 having either a C.T.E. close to that of the semiconductor device 54, that of the base 122 or intermediate thereof, is bonded to and electrically interconnected to the device 54 through solder balls 70. The circuit board 172 has a support layer 174, an interior array of circuit traces 176 aligning with input/output pads on the semiconductor device 54 and an exterior array of circuit traces 178 electrically interconnected to circuit traces on the surface of the package base 122.

When the semiconductor device is silicon, the support layer 174 can be alumina, FR-4 glass filled epoxy or other suitable material. The circuit traces are any suitable material such as copper on a moly-manganese metallization.

A cover 180, either a discrete cover adhesively bonded to the base 122, as illustrated, or a potting compound, encapsulates the device 54.

Figure 18:
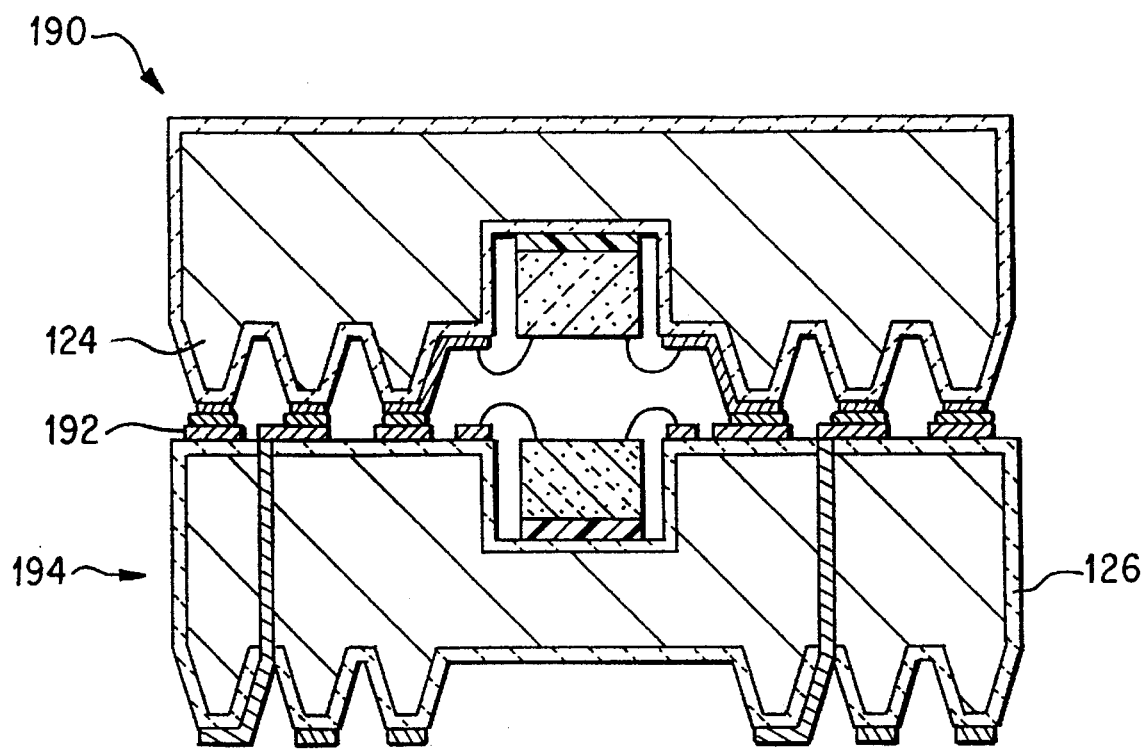
FIG. 18 shows in cross sectional representation two integrally bumped electronic packages nested together.

FIG. 18 illustrates in cross sectional representation a unique application of the integrally bumped packages of the invention. The conductive bumps of a first package 190 may be bonded to and electrically interconnected to circuit traces 192 formed on a second package 194. Through the use of integral bumps 124 and circuit traces formed on an insulative layer 126, any number of electronic packages may be nested, greatly increasing the package density on a printed circuit board.

While the electronic packages of the invention have been described in terms of primarily metallic bases, the bases can also be formed from other suitable materials such as plastics, ceramics, metal/ceramic composites (cermets) and glass/ceramic composites (cerglasses).

It is apparent that there has been provided in accordance with this invention, a method for the manufacture of a leadframe and an electronic package having integral bumps that fully satisfies the objects, features and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications and variations as fall within the spirit and broad scope of the appended claims.

We claim:

1. A ball grid array electronic package having improved thermal conductivity and reduced solder member creep, comprising:

a base selected from the group consisting of aluminum and aluminum alloys having first and second opposing sides;

an anodization layer coating at least a portion of said base;

a cavity formed in said first surface;

a semiconductor device bonded to the base in said cavity;

a metallized circuit trace directly on said anodization layer extending from said cavity to a peripheral portion of said first surface of said base, said metallized circuit trace electrically interconnected to said semiconductor device and bonded to a solder member; and a cover sealing said cavity and encapsulating said semiconductor device and an inner portion of said metallized circuit trace.

2. The electronic package of claim 1 wherein that portion of said anodization layer underlying said potting compound is contains pores and that portion of said anodization layer underlying said metallized circuit trace is sealed.

3. The electronic package of claim 1 wherein said anodization layer contains a uniform dispersion of pores.

4. The electronic package of claim 3 wherein said pores have an average diameter of from 50 angstroms to 500 angstroms.

5. The electronic package of claim 3 wherein said solder member is solder balls bonded to a peripheral portion of said metallized circuit trace.

6. The electronic package of claim 3 wherein said solder member is solder pads bonded to a peripheral portion of said metallized circuit trace.

7. The electronic package of claim 3 wherein said cover is discrete and adhesively sealed to said base.

8. The electronic package of claim 3 wherein said cover is a potting compound filling said cavity.

9. A component for a ball grid array electronic package having improved thermal conductivity and reduced solder member creep, comprising:

a base selected from the group consisting of aluminum and aluminum alloys having first and second opposing sides;

an anodization layer coating at least a portion of said base;

a cavity formed in said first surface; and a metallized circuit trace directly on said anodization layer extending from said cavity to a peripheral portion of said first surface of said base, said metallized circuit trace electrically interconnected to said semiconductor device and bonded to a solder member.

10. The component of claim 9 wherein said anodization layer contains a uniform dispersion of pores.

11. The component of claim 10 wherein said pores have an average diameter of from 50 angstroms to 500 angstroms.

12. The component of claim 10 wherein said solder member is solder balls bonded to a peripheral portion of said metallized circuit trace.

13. The component of claim 10 wherein said solder member is solder pads bonded to a peripheral portion of said metallized circuit trace.

* * * * *